United States Patent
Li et al.

(10) Patent No.: US 9,985,116 B2
(45) Date of Patent: May 29, 2018

(54) METHOD FOR PROCESSING POLYSILICON THIN FILM AND METHOD FOR FABRICATING THIN FILM TRANSISTOR

(71) Applicant: BOE Technology Group Co., Ltd., Beijing (CN)

(72) Inventors: Xiaolong Li, Beijing (CN); Zheng Liu, Beijing (CN); Dong Li, Beijing (CN); Huijuan Zhang, Beijing (CN); Jian Min, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days. days.

(21) Appl. No.: 15/350,844

(22) Filed: Nov. 14, 2016

(65) Prior Publication Data
US 2017/0194461 A1  Jul. 6, 2017

(30) Foreign Application Priority Data
Jan. 4, 2016  (CN) .......................... 2016 1 0004494

(51) Int. Cl.
  *H01L 21/00*  (2006.01)
  *H01L 29/66*  (2006.01)
  *H01L 21/3065*  (2006.01)
  *H01L 21/02*  (2006.01)
  *H01L 29/786*  (2006.01)

(52) U.S. Cl.
  CPC .. *H01L 29/66757* (2013.01); *H01L 21/02532* (2013.01); *H01L 21/02595* (2013.01); *H01L 21/3065* (2013.01); *H01L 29/78675* (2013.01)

(58) Field of Classification Search
  CPC ......... H01L 21/02532; H01L 21/02595; H01L 21/3065; H01L 29/4908; H01L 29/42384; H01L 29/66757; H01L 29/78675
  USPC .................................................. 438/149–167
  See application file for complete search history.

(56) References Cited

U.S. PATENT DOCUMENTS 5,685,950 A * 11/1997 Sato .................. H01L 21/02071
                                                            438/713
2004/0055999 A1    3/2004 Chen et al.
2007/0267635 A1* 11/2007 Chang ................. H01L 29/4908
                                                            257/72
2015/0144960 A1*  5/2015 Saia .................... H01L 29/4933
                                                            257/77

FOREIGN PATENT DOCUMENTS

CN         1307730 A    8/2001
CN       103495907 A    1/2014

OTHER PUBLICATIONS

Sep. 24, 2017—(CN) First Office Action Appn 201610004494.X with English Tran.

(Continued)

*Primary Examiner* — Brook Kebede
(74) *Attorney, Agent, or Firm* — Banner & Witcoff, Ltd.

(57) ABSTRACT

A method for processing a polysilicon thin film and a method for fabricating a thin film transistor are provided. The method for processing a polysilicon thin film includes: etching the polysilicon thin film using etching particles. An angle between an incident direction of the etching particles and the polysilicon thin film is larger than 0° and less than 90°.

15 Claims, 3 Drawing Sheets

(56) References Cited

OTHER PUBLICATIONS

Kailing Zheng, "Ion Beam Polishing Technology", Modem Weaponry, Sep. 28, 1982, vol. 9, pp. 21-25.
Chu Jiaru, et al., "Observation of Nanometer Structures on Ion Polished Si Surfaces by Scanning Force Microscopy", Journal of Chinese Electron Microscopy Society, Feb. 25, 1995, vol. 1, pp. 53-56.

* cited by examiner

METHOD FOR PROCESSING POLYSILICON THIN FILM AND METHOD FOR FABRICATING THIN FILM TRANSISTOR

This application claims priority to and the benefit of Chinese Patent Application No. 201610004494.X, filed on Jan. 4, 2016, which application is incorporated herein in its entirety.

TECHNICAL FIELD

Embodiments of the disclosure relate to a method for processing a polysilicon thin film and a method for fabricating a Thin Film Transistor (TFT).

BACKGROUND

A display device comprises an array substrate, which has TFTs disposed thereon. The TFT comprises a gate electrode, a gate insulation layer, an active layer, a source electrode and a drain electrode. As polysilicon has high electron mobility, the active layer of the TFT is mainly formed of polysilicon such that the TFT has a fast response speed.

SUMMARY

According to embodiments of the disclosure, a method for processing a polysilicon thin film is provided. The method comprises: etching the polysilicon thin film using etching particles. An angle between an incident direction of the etching particles and the polysilicon thin film is larger than 0° and less than 90°.

For example, the angle between the incident direction of the etching particles and the polysilicon thin film is larger than 30° and less than 90°

For example, the etching the polysilicon thin film using etching particles comprises: fixing a substrate having the polysilicon thin film formed thereon on a supporting platform placed in an electromagnetic resonant cavity; tilting the supporting platform such that an angle between the tilted supporting platform and a horizontal plane is larger than 0° and less than 90°; applying a negative bias to the supporting platform; introducing an inert gas to the electromagnetic resonant cavity; allowing the inert gas to form a plasma, wherein the plasma moves downwards; and etching the polysilicon thin film using the plasma.

For example, a one-time etching area of the plasma is smaller than an area of the polysilicon thin film, and the etching the polysilicon thin film using etching particles further comprises: moving the supporting platform along a horizontal direction so as to allow the plasma to etch the whole polysilicon thin film homogeneously during etching the polysilicon thin film using the plasma.

For example, a coupling antenna is disposed on top of the electromagnetic resonant cavity, and a range of the plasma is adjusted by adjusting a length of a portion of the coupling antenna extending into the electromagnetic resonant cavity, such that the one-time etching area of the plasma is smaller than the area of the polysilicon thin film.

For example, a range of the plasma is adjusted by adjusting a height from the supporting platform to a bottom of the electromagnetic resonant cavity in the case that the supporting platform is placed horizontally, such that the one-time etching area of the plasma is smaller than the area of the polysilicon thin film.

For example, a waveguide is connected to the electromagnetic resonant cavity, three tuner pins are provided on the waveguide, and a range of the plasma is adjusted by adjusting a length of a portion of each of the three tuner pins extending into the waveguide, such that the one-time etching area of the plasma is smaller than the area of the polysilicon thin film.

For example, a moving speed of the supporting platform is 5 mm/s±0.5 mm/s.

For example, the inert gas is argon, and the plasma is argon plasma.

For example, a flux of the argon is 300 sccm±30 sccm.

For example, a pressure of the argon in the electromagnetic resonant cavity is 0.1 Pa±0.01 Pa.

For example, the argon plasma is generated by treating the argon with a RF power source of a frequency of 13.56 MHz.

For example, the negative bias applied to the supporting platform is −15 V±1.5 V.

For example, the etching lasts 0.5 hour to 1 hour.

According to the embodiments of the disclosure, a method for fabricating a thin film transistor is provided. The method comprises: forming a polysilicon thin film on a substrate; processing the polysilicon thin film using the method as described above; and patterning the processed polysilicon thin film to form an active layer of the thin film transistor.

For example, the method for fabricating the thin film transistor further comprises forming a gate electrode, a gate insulation layer, a source electrode and a drain electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
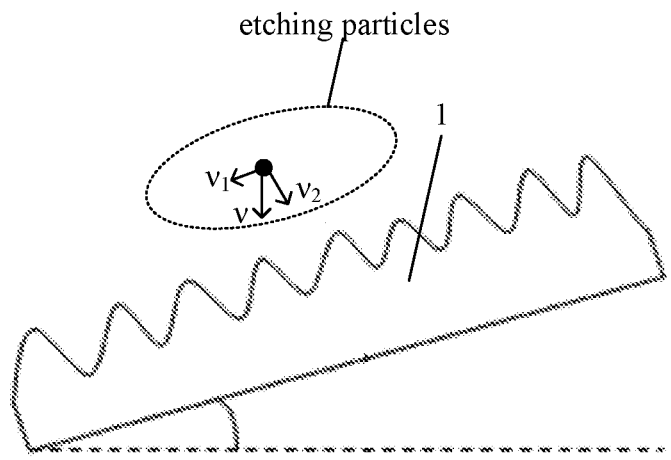
FIG. 1 schematically illustrates a process of processing a polysilicon thin film in accordance with embodiments of the disclosure.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Similarly, expressions such as "one", "a/an" or "the" or the like do not denote quantitative limitation, but rather indicate there is at least one. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed.

In a process of fabricating a polysilicon thin film, a laser anneal technology, such as green laser anneal (GLA) technology, is generally employed. For example, firstly an amorphous silicon thin film is formed on a base substrate, then a laser anneal process is applied to the amorphous silicon thin film to allow the amorphous silicon thin film to transform to the polysilicon thin film. During the amorphous silicon thin film is transformed to the polysilicon thin film, a center of crystal nucleus is cured first and a grain boundary is cured at last; moreover, a density of a fused silicon is different from that of a solid silicon. Accordingly, the formed polysilicon thin film has a bulging grain boundary, so that the formed polysilicon thin film has a high surface roughness.

The inventors found that, the higher the surface roughness of the polysilicon thin film is, the larger a leakage current of the TFT using the polysilicon thin film as the active layer is. Actually, in the case that the surface roughness is doubled, the leakage current will increase by two orders of magnitude. As a result, in the case that the polysilicon thin film fabricated through the laser anneal technology functions as the active layer of the TFT, the leakage current of the TFT is large, and the display device using the TFT has a poor display effect.

Embodiments of the disclosure provide a method for processing a polysilicon thin film. As illustrated in FIG. 1, the method for processing the polysilicon thin film comprises: etching the polysilicon thin film 1 using etching particles, wherein an angle between an incident direction of the etching particles and the polysilicon thin film 1 is larger than 0° and less than 90°. Exemplarily, the etching particles are particles having physical bombardment capability, such as plasma, atoms and the like. The angle is an acute angle between the incident direction of the etching particles and a plane on which the polysilicon thin film 1 is provided.

Considering the operability and the efficiency of the processing method, in the embodiments of the disclosure, the angle between the incident direction of the etching particles and the polysilicon thin film 1 for example is larger than 30° and less than 90°.

In the method for processing the polysilicon thin film provided by the embodiments of the disclosure, the etching particles are used to etch the polysilicon thin film 1, and the angle between the incident direction of the etching particles and the polysilicon thin film 1 is larger than 0° and less than 90°, thus allowing a speed v of the etching particles to have a component v1 along the direction parallel to the polysilicon thin film 1 and a component v2 along a direction orthogonal to the polysilicon thin film 1. The component v1 along the direction parallel to the polysilicon thin film 1 causes a physical collision between the etching particles and silicon atoms at the bulging grain boundary on the surface of the polysilicon thin film 1 so that the etching particles etch a part of silicon atoms off, thus reducing a surface roughness of the polysilicon thin film 1 and reducing a leakage current of a TFT using the polysilicon thin film as an active layer thereof, thereby effectively improving a display effect of a display device using the TFT. Moreover, during processing the polysilicon thin film 1 using the method for processing the polysilicon thin film, the physical collision also occurs between the etching particles and silicon atoms at the non-grain-boundary region on the surface of the polysilicon thin film 1; however, only the component v2 along the direction orthogonal to the polysilicon thin film 1 has contribution to such collision, so that damages at the non-grain-boundary on the surface of the polysilicon thin film 1 is relatively small during the processing process. Furthermore, the reduction of the surface roughness of the polysilicon thin film 1 makes it difficult for the polysilicon thin film 1 to adsorb various grains, which is beneficial to keep the polysilicon thin film 1 clean.

Figure 2:
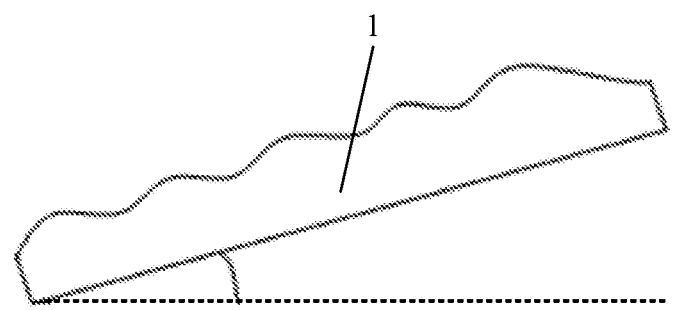
FIG. 2 schematically illustrates a processed polysilicon thin film in accordance with the embodiments of the disclosure.

As illustrated in FIG. 2, a height difference between the grain boundary and the non-grain-boundary region after the polysilicon thin film 1 is processed is reduced remarkably. The inventors find that, in the case that the surface roughness Ra of the polysilicon thin film 1 is about 15 nm, the surface roughness Ra after the polysilicon thin film 1 is processed is reduced to about 7 nm, and the leakage current of the TFT using the polysilicon thin film 1 as the active layer thereof is reduced from 1E-12A to 1E-13A.

Moreover, though the conventional technologies can reduce the leakage current of the TFT through increasing a thickness of a gate insulation layer, such a solution causes problems such as a response speed of the display device being decreased, a driving current of the TFT and a capacity of a storage capacitor being decreased, an amount of charges trapping by the gate insulation layer being increased, a drift of a threshold voltage of the TFT becoming more serious and son on. In contrast, in the embodiments of the disclosure, by processing the polysilicon thin film 1 functioning as the active layer of the TFT using the above method, the leakage current of the TFT is reduced, thereby allowing the thickness of the gate insulation layer to be relatively small, which not only avoids the above problems effectively, but also guarantees a better display effect of the display device.

Figure 3:
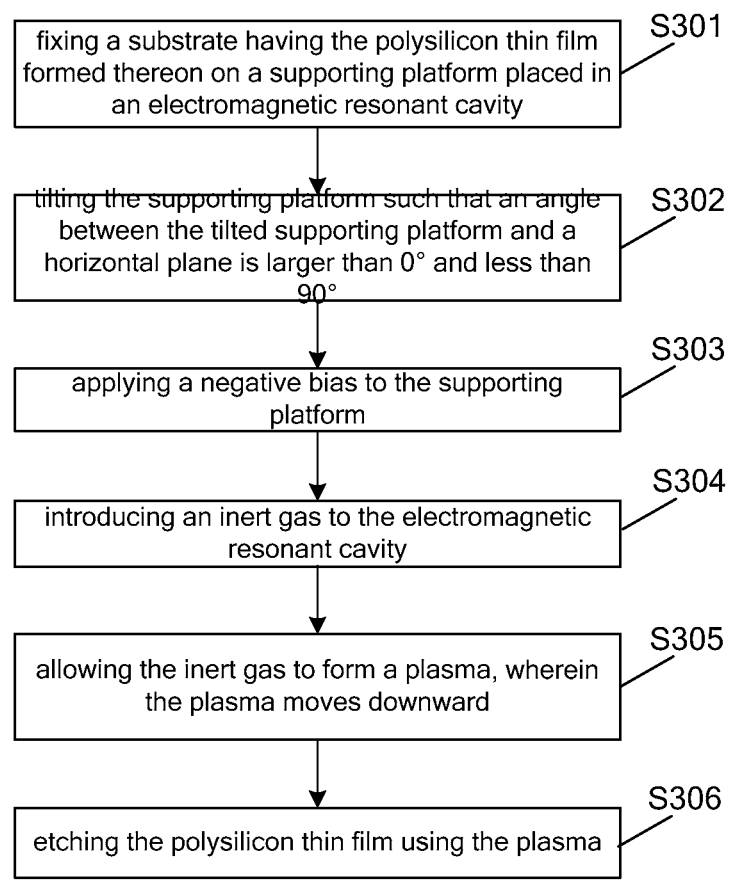
FIG. 3 schematically illustrates a flow chart of a method for processing a polysilicon thin film in accordance with the embodiments of the disclosure.
Figure 4:
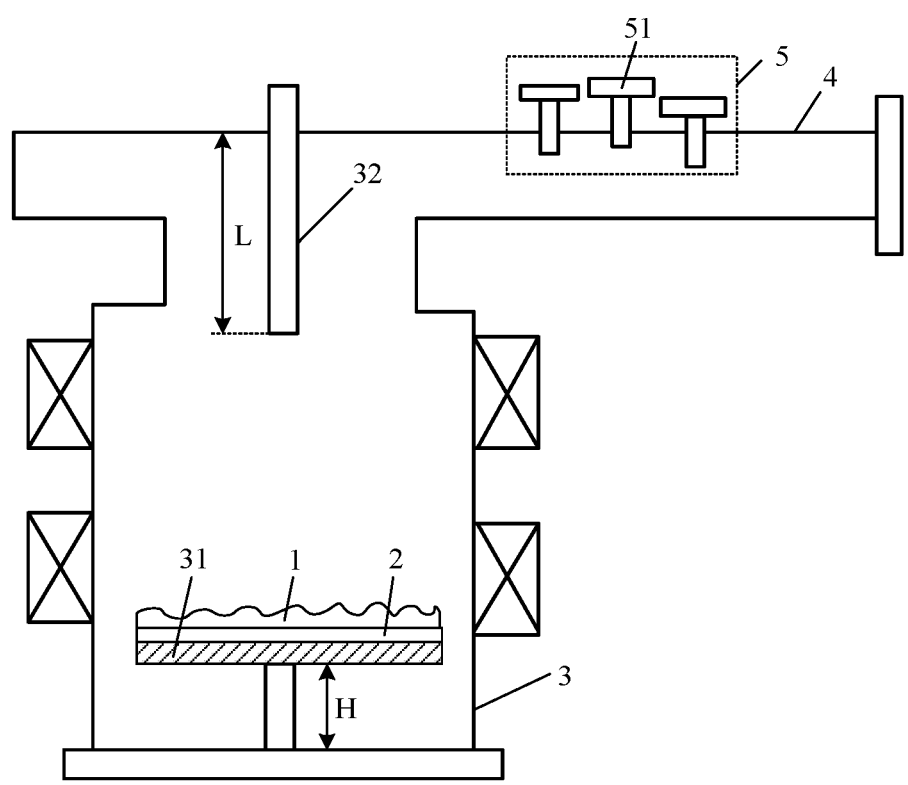
FIG. 4 schematically illustrates an electromagnetic resonant cavity in accordance with the embodiments of the disclosure.

As described above, various types of etching particles can be employed in the embodiments of the disclosure. In order to make those skilled in the art to understand and implement the disclosure, in the following, the embodiments of the disclosure will provide an exemplary method for processing the polysilicon thin film by taking the case that the etching particles are plasma as an example. As illustrated in FIG. 3 and FIG. 4, in the method, the step of etching the polysilicon thin film 1 using the etching particles for example comprises the following steps, and the angle between the incident direction of the etching particles and the polysilicon thin film is larger than 0° and less than 90°.

Step S301: fixing a substrate 2 having the polysilicon thin film 1 formed thereon on a supporting platform 31 in an electromagnetic resonant cavity 3. For example, a feed valve of the electromagnetic resonant cavity 3 is opened, the substrate 2 having the polysilicon thin film 1 formed thereon is placed on the supporting platform 31 in the electromagnetic resonant cavity 3, and then the feed valve is closed and a vacuum pumping process is applied to the electromagnetic resonant cavity 3. Exemplarily, in the case that the polysilicon thin film 1 functions as the active layer of the TFT and the TFT is a bottom-gate-type TFT, a gate electrode and a gate insulation layer are formed on the substrate 2 successively, and the polysilicon thin film 1 is formed on the gate insulation layer. The substrate 2 for example is a glass substrate or a quartz substrate.

Step S302: tilting the supporting platform 31 such that the angle between the tilted supporting platform 31 and a horizontal plane is larger than 0° and less than 90°. As the substrate 2 having the polysilicon thin film 1 formed thereon is fixed on the supporting platform 31, an angle between the polysilicon thin film 1 and the horizontal plane is the same as the angle between the tilted supporting platform 31 and the horizontal plane. Moreover, the plasma formed in the electromagnetic resonant cavity 3 is incident vertically downwards, thereby allowing the angle between the incident direction of the plasma and the polysilicon thin film 1 to be larger than 0° and less than 90°. As shown in FIG. 1, in the case that the angle between the tilted supporting platform 31 and the horizontal plane is too small, the component v1 of the speed of the etching particles along the direction parallel to the polysilicon thin film 1 will be too small, making it is impossible for the method to significantly reduce the surface roughness of the polysilicon thin film 1. Moreover, in the case that the angle between the tilted supporting platform 31 and the horizontal plane is too large, though the component v1 of the speed of the etching particles along the direction parallel to the polysilicon thin film 1 becomes larger, but a volume of the electromagnetic resonant cavity 3 has to be relatively large, it is difficult to generate the plasma, and the generated plasma will gather at a higher end of the polysilicon thin film 1, thereby causing the etching effect and the surface roughness of the polysilicon thin film 1 to be inhomogeneous. Exemplarily, in the embodiments of the disclosure, the angle between the tilted supporting platform 31 and the horizontal plane is about 45°.

Step S303: applying a negative bias to the supporting platform 31. As the supporting platform 31 is generally formed of metal, the negative bias for example is applied to the supporting platform 31 by connecting an electrode wire to the supporting platform 31 and then connecting the electrode wire to a power supply. In the case that the negative bias applied to the supporting platform 31 is too large, the speed of the plasma will be too large, and the physical bombardment of the plasma to the substrate 2 having the polysilicon thin film 1 formed thereon will be too strong, which easily damages the substrate 2. In the case that the negative bias applied to the supporting platform 31 is too small, the speed of the plasma will be too small, the physical bombardment of the plasma to the substrate 2 having the polysilicon thin film 1 formed thereon will be too weak, making it impossible to reduce the surface roughness of the polysilicon thin film 1 effectively. Exemplarily, the negative bias applied to the supporting platform 31 is −15 V±1.5 V.

Step S304: introducing an inert gas to the electromagnetic resonant cavity 3. The inert gas for example is argon, which is easily available such that a cost of the method for processing the polysilicon thin film is reduced. The larger a flux of argon is, the larger the etching speed of the argon plasma to the polysilicon thin film 1 will be, but the worse the etching homogeneity is. Exemplarily, the flux of the argon is 300 sccm±30 sccm in the embodiments of the disclosure. The larger a pressure of the argon in the electromagnetic resonant cavity 3 is, the larger the etching speed of the argon plasma to the polysilicon thin film 1 is, but the etching homogeneity will be worse. Exemplarily, the pressure of the argon in the electromagnetic resonant cavity 3 is 0.1 Pa±0.01 Pa.

Step S305, allowing the inert gases to form a plasma so that the plasma moves vertically downwards. For example, in the embodiments of the disclosure, the plasma is generated by treating the inert gases with a RF (Radio Frequency) power source, and a frequency of the RF power source is selected according to types of the inert gases and/or types of ion clusters of the plasma to be formed and/or the volume of the electromagnetic resonant cavity 3. Exemplarily, in the case that the inert gas is argon, the argon is treated with the RF power source having the frequency of 13.56 MHz to allow the argon gas to form the argon plasma in the embodiments of the disclosure.

Step S306, etching the polysilicon thin film using the plasma.

In order to prevent the problems that some regions of the polysilicon thin film 1 are etched heavily while other regions are etched slightly by the plasma, causing a poor homogeneity of the surface roughness of the polysilicon thin film 1, exemplarily, in the embodiments of the disclosure, an one-time etching area of the plasma is smaller than an area of the polysilicon thin film, thereby allowing the plasma to etch the whole polysilicon thin film 1 homogeneously by moving the supporting platform 31 along the horizontal direction during etching the polysilicon thin film 1 using the plasma.

Exemplarily, the moving speed of the supporting platform 31 is 5 mm/s±0.5 mm/s in the embodiments of the disclosure such that the homogeneity of the surface roughness of the processed polysilicon thin film 1 is good and the method for processing the polysilicon thin film has a relatively high processing efficiency.

Exemplarily, as illustrated in FIG. 4, in the embodiments of the disclosure, it is possible to adjust a range of the plasma by adjusting a length L of a portion of a coupling antenna 32 extending into the electromagnetic resonant cavity 3 (the coupling antenna 32 is disposed on top of the electromagnetic resonant cavity 3) and/or a height H from the supporting platform 31 to the bottom of the electromagnetic resonant cavity 3 in the case that the supporting platform 31 is placed horizontally and/or a length of a portion of each of three tuner pins 51 extending into a waveguide 4 (the three-tuner pins 5 are provided on the waveguide 4 and the waveguide 4 is connected to the electromagnetic resonant cavity 3), thereby allowing the one-time etching area of the plasma to be smaller than the area of the polysilicon thin film 1. In the case that the length L of the portion of the coupling antenna 32 extending into the electromagnetic resonant cavity 3 increases, the range of the plasma along the vertical direction will be reduced, and the range of the plasma along the horizontal direction will be increased. In the case that the height H from the supporting platform 31 to the bottom of the electromagnetic resonant cavity 3 when the supporting platform 31 is placed horizontally, the range of the plasma along the vertical direction will be reduced, and the range of the plasma along the horizontal direction will be increased.

It should be understood that, those skilled in the art may allow the one-time etching area of the plasma to be smaller than the area of the polysilicon thin film 1 by other means, which will not be limited in the embodiments of the disclosure. As an example, different shapes are employed by the electromagnetic resonant cavity 3 such that the one-time etching area of the plasma is smaller than the area of the polysilicon thin film.

For example, the etching to the polysilicon thin film 1 using the plasma lasts 0.5 hour to 1 hour, such that the surface roughness of the processed polysilicon thin film 1 is reduced effectively, and the method for processing the polysilicon thin film has a relatively high processing efficiency.

It should be noted that, the detailed implementations of steps S301 to S306 are not limited to the above descriptions.

Moreover, the detailed implementation of the step of etching the polysilicon thin film 1 using a single type of etching particle or different types of etching particles is not limited to the above description either. Those skilled in the art can choose proper solutions as needed, which will not be elaborated herein.

Furthermore, the embodiments of the disclosure further provide a method for fabricating a TFT, and the method comprises: forming an amorphous silicon thin film on a substrate; transforming the amorphous silicon thin film to a polysilicon thin film for example by using a laser anneal technology, such as GLA technology; processing the polysilicon thin film using the method for processing the polysilicon thin film; patterning the processed polysilicon thin film so as to form a pattern comprising an active layer. The method for fabricating the TFT for example comprises: forming a gate electrode, a gate insulation layer, the active layer, a source electrode and a drain electrode on the substrate. The substrate for example is a glass substrate or a quartz substrate.

Exemplarily, a gate metal layer is firstly formed on the substrate and a pattern comprising the gate electrode is formed through a patterning process. Next, the gate insulation layer is formed on the substrate. After that, the active layer is formed on the substrate. Finally, a source/drain electrode metal layer is formed on the substrate and patterns of the source electrode and the drain electrode are formed through a patterning process.

It should be noted that, during fabricating the bottom-gate-type TFT, the steps of forming the gate electrode, the gate insulation layer, the active layer, the source electrode and the drain electrode on the substrate are not limited to the above steps, which will not be limited in the embodiments of the disclosure. Moreover, during fabricating a top-gate-type TFT, those skilled in the art can refer the above description to realize the specific implementation of the steps of forming the gate electrode, the gate insulation layer, the active layer, the source electrode and the drain electrode on the substrate, and select the steps according to practical requirements, and it ill not be elaborated herein.

In the method for fabricating the TFT provided by the embodiments of the disclosure, the polysilicon thin film is processed as above during forming the active layer, thus reducing the surface roughness of the polysilicon thin film, i.e., reducing the surface roughness of the active layer and the leakage current of the TFT, thereby allowing the TFT to improve the display effect of the display device in the case that the TFT is employed by the display device.

What is described above is related to the illustrative embodiments of the disclosure only and not limitative to the scope of the disclosure; the scopes of the disclosure are defined by the accompanying claims.

The present application claims priority from Chinese Application No. 201610004494.X, filed on Jan. 4, 2016, the disclosure of which is incorporated herein by reference in its entirety.

What is claimed is:

1. A method for processing a polysilicon thin film, comprising:
    etching the polysilicon thin film using etching particles, wherein an angle between an incident direction of the etching particles and the polysilicon thin film is larger than 0° and less than 90°;
    wherein the etching the polysilicon thin film using etching particles comprises:
        fixing a substrate having the polysilicon thin film formed thereon on a supporting platform placed in an electromagnetic resonant cavity;
        tilting the supporting platform such that an angle between the tilted supporting platform and a horizontal plane is larger than 0° and less than 90°;
        applying a negative bias to the supporting platform;
        introducing an inert gas to the electromagnetic resonant cavity;
        allowing the inert gas to form a plasma, wherein the plasma moves downwards; and
        etching the polysilicon thin film using the plasma.

2. The method for processing the polysilicon thin film of claim 1, wherein the angle between the incident direction of the etching particles and the polysilicon thin film is larger than 30° and less than 90°.

3. The method for processing the polysilicon thin film of claim 1, wherein a one-time etching area of the plasma is smaller than an area of the polysilicon thin film, and the etching the polysilicon thin film using etching particles further comprises:
    moving the supporting platform along a horizontal direction so as to allow the plasma to etch the whole polysilicon thin film homogeneously during etching the polysilicon thin film using the plasma.

4. The method for processing the polysilicon thin film of claim 3, wherein a coupling antenna is disposed on top of the electromagnetic resonant cavity, and a range of the plasma is adjusted by adjusting a length of a portion of the coupling antenna extending into the electromagnetic resonant cavity, such that the one-time etching area of the plasma is smaller than the area of the polysilicon thin film.

5. The method for processing the polysilicon thin film of claim 3, wherein a range of the plasma is adjusted by adjusting a height from the supporting platform to a bottom of the electromagnetic resonant cavity in a case that the supporting platform is placed horizontally, such that the one-time etching area of the plasma is smaller than the area of the polysilicon thin film.

6. The method for processing the polysilicon thin film of claim 3, wherein a waveguide is connected to the electromagnetic resonant cavity, three tuner pins are provided on the waveguide, and a range of the plasma is adjusted by adjusting a length of a portion of each of the three tuner pins extending into the waveguide, such that the one-time etching area of the plasma is smaller than the area of the polysilicon thin film.

7. The method for processing the polysilicon thin film of claim 3, wherein a moving speed of the supporting platform is 5 mm/s ±0.5 mm/s.

8. The method for processing the polysilicon thin film of claim 1, wherein the inert gas is argon, and the plasma is argon plasma.

9. The method for processing the polysilicon thin film of claim 8, wherein a flux of the argon is 300 sccm±30 sccm.

10. The method for processing the polysilicon thin film of claim 8, wherein a pressure of the argon in the electromagnetic resonant cavity is 0.1 Pa±0.01 Pa.

11. The method for processing the polysilicon thin film of claim 8, wherein the argon plasma is generated by treating the argon with a RF power source of a frequency of 13.56 MHz.

12. The method for processing the polysilicon thin film of claim 1, wherein the negative bias applied to the supporting platform is −15 V±1.5 V.

13. The method for processing the polysilicon thin film of claim 1, wherein the etching lasts 0.5 hour to 1 hour.

14. A method for fabricating a thin film transistor, comprising:
   forming a polysilicon thin film on a substrate;
   processing the polysilicon thin film using the method of claim 1; and
   patterning the processed polysilicon thin film to form an active layer of the thin film transistor.

15. The method of claim 14, further comprising forming a gate electrode, a gate insulation layer, a source electrode and a drain electrode.

* * * * *